(12) United States Patent
Choy et al.

(10) Patent No.: US 8,351,276 B2
(45) Date of Patent: Jan. 8, 2013

(54) SOFT PROGRAM OF A NON-VOLATILE MEMORY BLOCK

(75) Inventors: Jon S. Choy, Austin, TX (US); Chen He, Austin, TX (US); Michael A. Sadd, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 387 days.

(21) Appl. No.: 12/835,309

(22) Filed: Jul. 13, 2010

(65) Prior Publication Data
US 2012/0014179 A1  Jan. 19, 2012

(51) Int. Cl.
*G11C 11/34* (2006.01)

(52) U.S. Cl. ............ 365/185.29; 365/185.3; 365/185.22

(58) Field of Classification Search .............. 365/185.29, 365/185.3, 185.22
See application file for complete search history.

(56) References Cited

U.S. PATENT DOCUMENTS

| | | | |
|---|---|---|---|
| 6,496,417 B1 * | 12/2002 | Shiau et al. | 365/185.2 |
| 7,023,737 B1 | 4/2006 | Wan et al. | |
| 7,092,290 B2 | 8/2006 | Hemink | |
| 7,177,199 B2 | 2/2007 | Chen et al. | |
| 7,619,930 B2 | 11/2009 | Mokhlesi | |

* cited by examiner

*Primary Examiner* — Son Dinh
*Assistant Examiner* — Nam Nguyen
(74) *Attorney, Agent, or Firm* — Joanna G. Chiu; James L. Clingan, Jr.

(57) ABSTRACT

A method includes erasing bits and identifying bits that have been over-erased by the erasing. A first subset of the bits that have been over-erased are soft programmed. The results of soft programming the first subset of bits is measured. An initial voltage condition from a plurality of possible voltage conditions based on the results from soft programming the first subset of bits is selected. A second subset of bits that have been over-erased are soft programmed. The soft programming applies the initial voltage condition to the bits in the second subset of bits. The second subset comprises bits that are still over-erased when the step of selecting occurs. The result is that the soft programming for the second subset may begin at a more optimum point for quickly achieving the needed soft programming to bring all of the bits within the desired erase condition.

20 Claims, 4 Drawing Sheets

SOFT PROGRAM OF A NON-VOLATILE MEMORY BLOCK

BACKGROUND

1. Field

This disclosure relates generally to non-volatile memories, and more specifically, to soft programming of a non-volatile memory block.

2. Related Art

During a typical erase operation of a non-volatile memory block (e.g., Flash or EEPROM), a pre-program is performed to raise the threshold voltages of the bits of the memory block to a level at or above a program verify voltage. For the erase operation, the pre-program is followed by a Fowler-Nordheim (FN) erase to lower the threshold voltages of the bits of the memory block to a level at or below an erase verify voltage. However, during the FN erase, the resulting distribution may include bits cells which have been overly erased, which results in increased column leakage. Furthermore, this problem of column leakage increases as the bitcells are further scaled, causing, for example, a subsequent program operation to fail due to lowered drain bias, or a read operation to fail since the over-erased bits may prevent sense amplifiers from distinguishing between an erased and a programmed bit. Therefore, a need exists to soft program or compress the distribution of the erased cells so as to reduce the column leakage. Furthermore, when bitcells become smaller, the total erase time is dominated by the soft program.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, an erase operation of a non-volatile memory block includes preprogramming the memory block, FN erasing the memory block, using an adaptive process to determine an initial voltage for subsequent soft programming, and then soft programming the memory block using the determined initial voltage in order to compress the distribution of the erased bits within the memory block. During the erasing of the memory block, bits within the memory block may be over-erased. A bit may be considered over-erased when its threshold voltage is below an acceptable minimum threshold voltage for an erased bit. Therefore, during soft programming of the memory block, programming pulses are iteratively applied to the bits which were over-erased so as to raise their threshold voltages to an acceptable level which aids in reducing column leakage. In one embodiment, the initial voltage determined during the adaptive process is a gate voltage that is initially applied as the programming pulse during the soft programming. In this embodiment, the adaptive process uses a subset of the bits within the memory block to determine the initial gate voltage which results in fewer iterations for the subsequent soft programming as compared to current methods which begin with a more conservative gate voltage. Alternatively, the adaptive process may be used to determine other initial voltages or conditions in addition to or in place of the initial gate voltage to be used during soft programming (such as, for example, a drain voltage). Therefore, by taking the time to perform the adaptive process to determine an improved initial voltage for soft programming, the number of iterations (and thus time) may be reduced during the subsequent soft programming.

Figure 1:
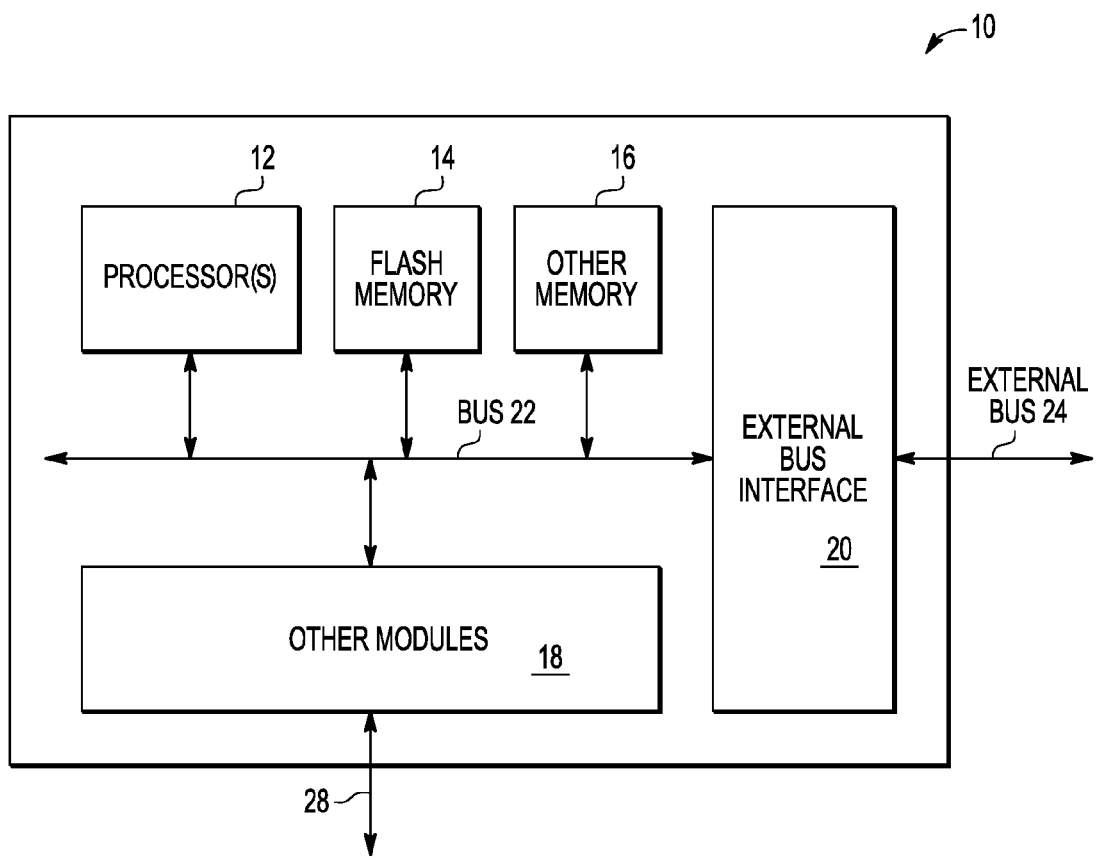
FIG. 1 illustrates, in block diagram form, an integrated circuit in accordance with one embodiment.

FIG. 1 illustrates, in block diagram form, an integrated circuit 10 in accordance with one embodiment. In the illustrated embodiment, integrated circuit (IC) 10 includes one or more processors 12, one or more flash memories 14, one or more other memories 16, one or more other modules 18, and an external bus interface 20 which may be bi-directionally coupled by way of bus 22. Alternate embodiments may not have a processor 12, may not have other memory 16, may not have other modules 18, and/or may not have external bus interface 20. In the illustrated embodiment, external bus interface 20 is coupled to an external bus 24 which may be used to communicate information to and from IC 10. In one embodiment, one or more of modules 12, 14, 16, and 18 may have one or more integrated circuit terminals (not shown) that are external to IC 10. Note that in some embodiments, IC 10 may have only one or more flash memories 14.

Figure 2:
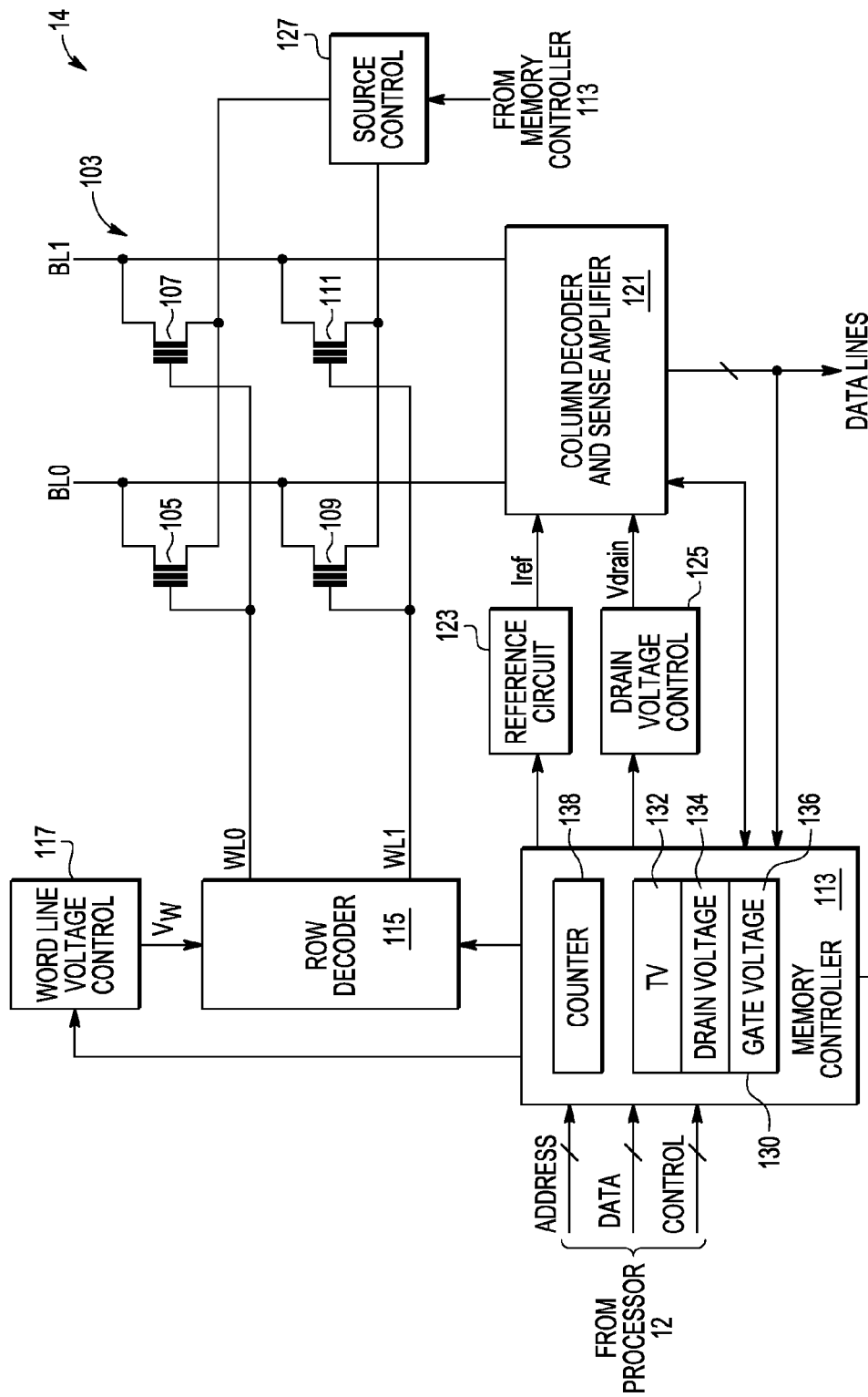
FIG. 2 illustrates, in partial schematic and partial block diagram form, a portion of a flash memory of FIG. 1 in accordance with one embodiment.

FIG. 2 illustrates, in partial schematic and partial block diagram form, a portion of flash memory 14 in accordance with one embodiment. Flash memory 14 includes a memory array 103 of memory cells (e.g. bitcells). In the illustrated embodiment, memory array 103 includes four bitcells 105, 107, 109, and 111. In one embodiment, the cells are floating gate flash memory cells although other types of flash memory cells (e.g. nanocrystals, split gate flash, nitride based memories) may be implemented. Also, other types of bitcells (e.g. EEPROM cells) may be implemented in array 103. Array 103 represents one memory block of memory 14, where memory 14 may include any number of memory blocks. Note that during an erase of a memory block, each bitcell of the memory block is erased in bulk. For example, during an erase of array 103, each of bitcells 105, 107, 109, and 111 are erased in bulk. In the embodiment shown, array 103 includes 4 memory cells (including 2 rows and 2 columns) for illustrative purposes, but may include a greater number of rows and columns in other embodiments. For example, each row of array 103 may include about 4096 bits, where each row may be further segmented into pages. In one embodiment, one page contains 256 bits and every bit of a page is separated by a fixed number of bits. For example, if each row is segmented into 16 pages, then every $16^{th}$ bit of a row belongs to a same page.

Memory 14 includes a row decoder 115 for selectively providing gate voltages Vw from word line voltage control circuit 117 to the word lines WL0 and WL1 during memory operations. These words lines are connected to the gates of the memory cells of array 103. Memory 14 also includes a column decoder and sense amplifier circuit 121 that includes sense amplifiers for coupling to the bit lines BL0 and BL1 for reading the cells of array 103 and circuitry for applying a Vdrain voltage from drain voltage control circuit 125 to the bit lines BL0 and BL1 during memory operations. Memory 14 also includes a source controller 127 which applies a common source voltage to the sources of the bitcells. Circuit 121 outputs the data read from the cells on data lines. Memory 14 also includes a current reference circuit 123 for supplying a reference current Iref to a reference sense amplifier of circuit 121 for voltage reads of the cells.

Memory 14 includes a memory controller 113 for controlling the operations of memory 14 during its operation. Controller 113 controls wordline voltage control 117, reference circuit 123, drain voltage control 125, and source control 127 to control the voltage and current values provided by those circuits during memory operation. Memory controller 113 also provides control information to control the operations of row decode circuit 115 and circuit 121 during memory operation. Controller 113 includes address, data, and control lines for receiving address, data, and control information from an external source (e.g. processor 12) for performing memory operations. Controller 113 also includes one or more counters 138 and storage circuitry 130. Storage circuitry 130 may store, for example, the value of a target voltage (TV), a drain voltage, and/or a gate voltage (which may be used during soft programming, as will be described below). For example, storage circuitry 130 may include a register 132 for storing TV, a register 134 for storing the drain voltage, and/or a register 136 for storing the gate voltage. As will be described below, the TV may be used to determine an initial gate voltage and/or drain voltage which is to be used during soft programming of array 103. Note that other memory circuits may have other configurations in other embodiments. Operation of memory 14, such as with respect to an erase operation, will be described in more detail below in reference to FIGS. 3-5. Note that row decoder 115 and column decoder and sense amplifier 121 may operate as known in the art.

Figure 3:
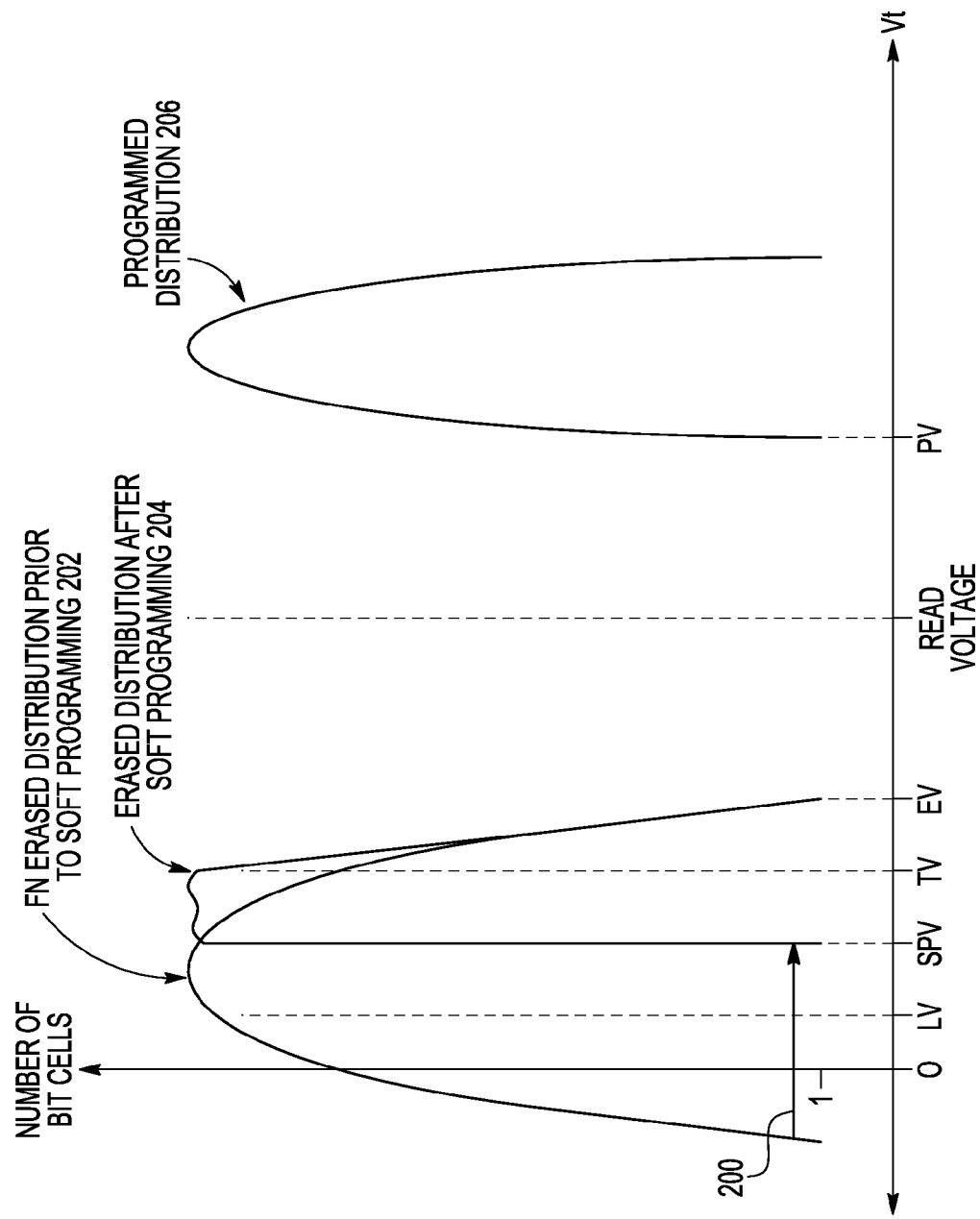
FIG. 3 illustrates, in graphical form, example bit distributions of the bitcells within a block of the flash memory.

FIG. 3 illustrates, in graphical form, bitcell threshold voltage distributions for erased bitcells and for programmed bitcells in accordance with one embodiment. Note that the vertical axis uses a logarithmic scale. In the illustrated graph, curve 202 shows the number of bitcells (represented by the vertical axis) that have the specified threshold voltage (represented by the horizontal axis) when the bitcells in a memory block of flash memory 14 are erased during an erase operation but prior to soft programming. In the illustrated graph, curve 204 shows the number of bitcells (represented by the vertical axis) that have the specified threshold voltage (represented by the horizontal axis) when the bitcells in the memory block of flash memory 14 are erased during an erase operation and after soft programming. The soft programming compresses the erased bits distribution such that the most erased side of the distribution (the portion of the distribution to the furthest left) is moved up to a minimum acceptable threshold voltage, represented by the soft program verify voltage (SPV), as illustrated by arrow 200. (Note that the SPV may also be referred to as a lowest desirable threshold voltage for an erased memory cell.) For example, those erased bits whose threshold voltage are at or below SPV may be considered over-erased. Therefore, during soft programming, only those over-erased bits are soft programmed so as to compress the distribution such that all erased bits have a threshold voltage of at least SPV. In this manner, reduced column leakage is achieved, as compared to the distribution of curve 202. In the illustrated graph, all erased bits have a threshold voltage of at most the erase verify voltage (EV). (Note that the EV may also be referred to as the maximum desirable threshold voltage for an erased memory cell.) Also, note that in one embodiment, only the most erased side of the distribution is shifted during soft programming, as shown by arrow 200, while the least erased side of the distribution (the portion of the distribution furthest right), is not shifted and remains at or below EV.

Also in the illustrated graph, curve 206 shows the number of bitcells (represented by the vertical axis) that have the specified voltage (represented by the horizontal axis) when the bitcells in the memory block of flash memory 14 are programmed. In the illustrated graph, all the programmed bits have a threshold voltage at or above the program verify voltage (PV). The horizontal gap between EV and the read voltage in FIG. 3 indicates the amount of read one margin of the bitcells, while the horizontal gap between PV and the read voltage in FIG. 3 indicates the amount of read zero margin of the bitcells In one embodiment, a target voltage (TV) is selected to be between SPV and EV, and will be used to determine an initial gate voltage for soft programming, as will be described below. In one embodiment, TV is half way between SPV and EV. Also, in one embodiment, a low voltage (LV) is selected between the threshold voltage of the most erased bit (MEB) and SPV which may also be used to determine the initial gate voltage for soft programming, as will be described below.

Figure 4:
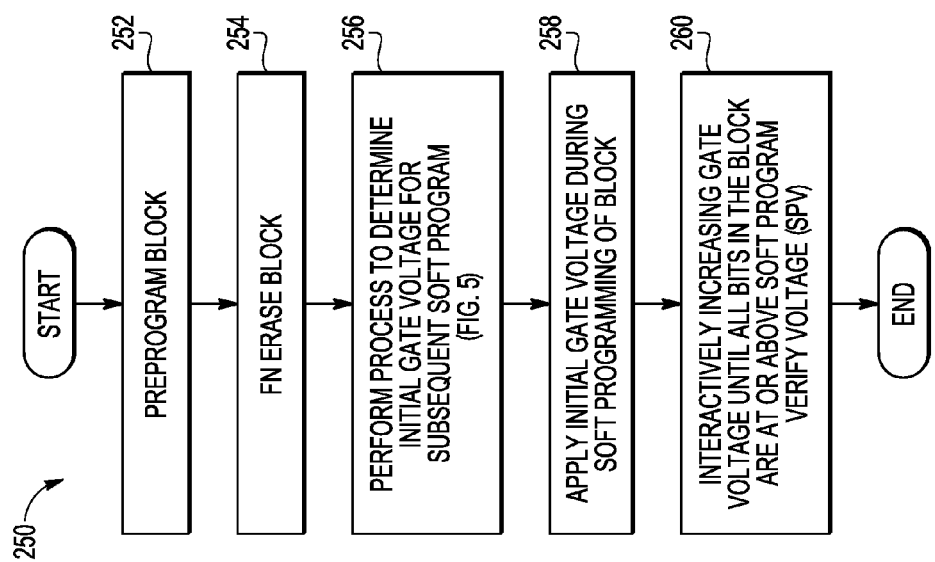
FIG. 4 illustrates, in flow diagram form, an erase operation in accordance with one embodiment.

FIG. 4 illustrates, in flow diagram form, an erase operation 250 in accordance with an embodiment of the present invention. Erase operation 250 is performed in a per-block basis of memory 14. For example, erase operation 250 may be performed on all of array 103. Erase operation begins with step 252 in which a block of memory 14 is preprogrammed. In one embodiment, during preprogramming, each bitcell is verified using PV, and if the threshold voltage of the bitcell is below PV, a program pulse is applied. Afterwards, each bitcell is again verified using PV, and if the threshold voltage of the bitcell is still below PV, a subsequent program pulse is applied. After preprogramming the block, the programmed bits distribution should be at or above PV, as illustrated by curve 206 in FIG. 3.

Flow then proceeds to step 254 in which the block of memory 14 which was preprogrammed is FN erased. In one embodiment, during this FN erase, each bitcell is verified using EV, and if the threshold voltage of the bitcell is above EV, an FN erase pulse is applied. Afterwards, each bitcell is again verified using EV, and if the threshold voltage of the bitcell is still above EV, a subsequent pulse is applied. For each iteration of applying the FN erase pulse, a stronger FN erase pulse may be applied. After FN erasing the block, the erased bits distribution should be at or below EV, as illustrated by curve 202 in FIG. 3, since EV is the maximum desired threshold voltage for being erased.

Flow then proceeds to step 256 in which an adaptive process is performed to determine an initial gate voltage for use in subsequent soft programming of the block. The process for determining this initial gate voltage will be described in more detail below in reference to FIG. 5.

Flow then proceeds to steps 258 and 260 in which the block is soft programmed. For example, after step 256, flow then proceeds to step 258 in which the initial gate voltage determined by the adaptive process in step 256 is applied during soft programming of the block. For example, for each bitcell in the block which does not verify at SPV (which is not already at or above SPV), an initial soft programming pulse at the initial gate voltage determined in step 256 is applied. Flow then proceeds to step 260 in which the gate voltage is iteratively increased until all bits in the block are at or above SPV since SPV is the minimum desired threshold voltage for being erased. For example, after the initial soft programming pulse is applied to those over-erased bitcells which did not verify at SPV, another verify is performed to determine which bitcells still do not verify at SPV (i.e. are still over-erased). For these bitcells, an increased gate voltage is applied. The verify and application of increasing gate voltage alternate until all bits in the block are at or above SPV. At this point, the erase operation is complete. In one embodiment, erase operation 250 is referred to as a user mode embedded erase operation.

Figure 5:
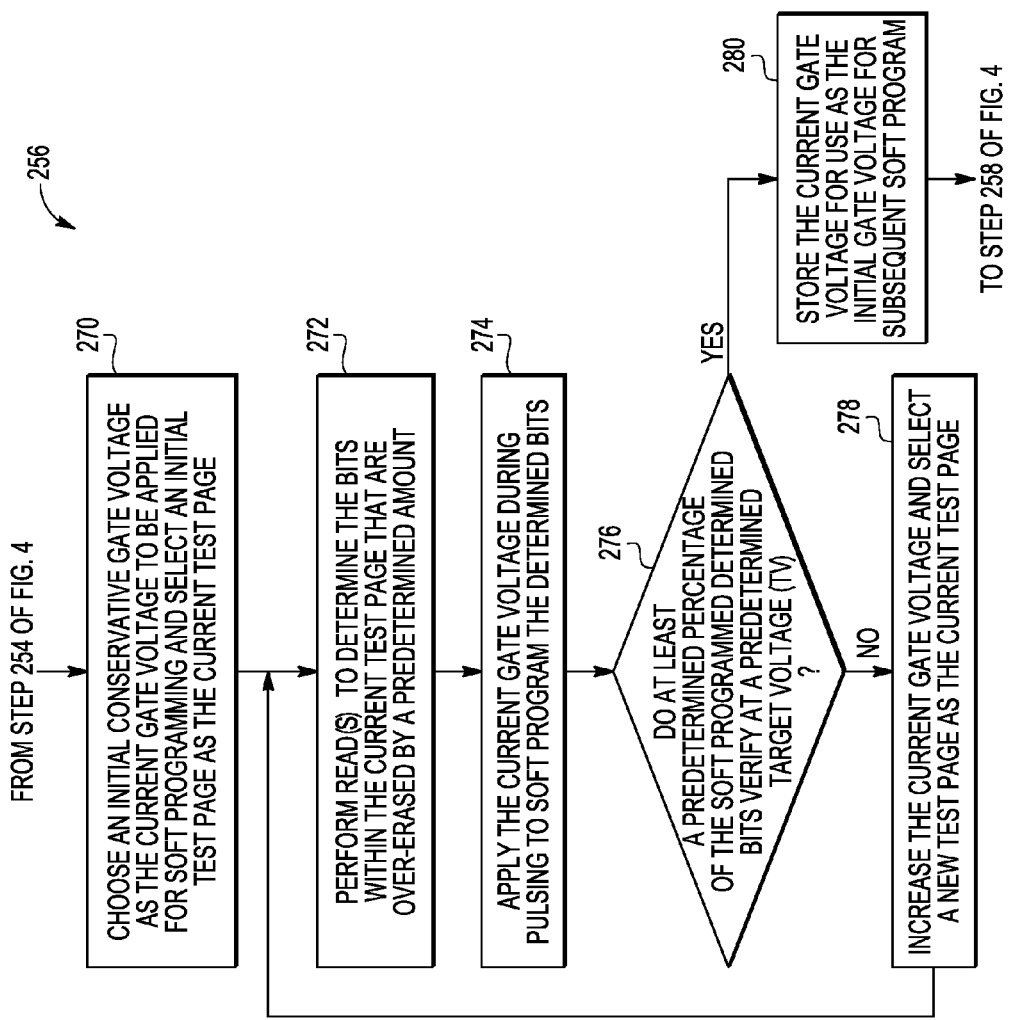
FIG. 5 illustrates, in flow diagram form, a process for determining an initial voltage for subsequent soft programming, in accordance with one embodiment.

FIG. 5 illustrates, in flow diagram form, a more detailed version of the adaptive process of step 256 of FIG. 4 in accordance with one embodiment. From step 254 of FIG. 4, flow proceeds to step 270 of FIG. 5 in which an initial conservative gate voltage is chosen as the current gate voltage which is to be applied for soft programming and an initial test page of the block on which the erase operation is being performed is selected as the current test page. The conservative gate voltage, for example, is chosen to ensure that the over-erased bits are not over soft programmed (i.e. not programmed to a level higher than EV). Flow then proceeds to step 272 in which one or more reads are performed to determine the bits within the current test page that are over-erased by a predetermined amount. (Note that the first time through step 272, the test page refers to the initial test page selected in step 270.) For example, in one embodiment, a first verify read of the current test page may be performed at SPV to determine which bits are at or below SPV, and a second verify read of the current test page may be performed at LV to determine which bits are at or above LV. With this information, the bits whose threshold voltages fall between LV and SPV, inclusively, may be determined. Therefore, in this example, the bits which are over-erased by a predetermined amount are those whose threshold voltages are at or below SPV but at or above LV. In another embodiment, the predetermined amount may differ and may include, for example, any bit which is over-erased (i.e. any bit whose threshold voltage is at or below SPV) without using a lower threshold voltage such as LV. In one embodiment, a count of how many bits are over-erased by the predetermined amount in the current test page is determined and can be stored, for example, in controller 113. Also, counter 138, using the data lines output from column decoder and sense amplifier 121, may determine the number of bits which have been over-erased.

Flow then proceeds to step 274 in which the current gate voltage is applied during pulsing to soft program the bits which were determined in step 272. For example, for those bits in the current test page which were determined to be over-erased by the predetermined amount, a soft program pulse using the current gate voltage is applied. The first time through step 274, the current gate voltage is the initial conservative gate voltage and the current test page is the initial test page.

Flow then proceeds to decision diamond 276 in which it is determined whether at least a predetermined percentage of the soft programmed determined bits (i.e. those bits soft programmed in step 274) verity at the predetermined target voltage (TV). In one embodiment, the predetermined percentage is 50 percent. Therefore, for this example, it is determined whether at least 50% of those bits which received the soft program pulse in step 274 have a threshold voltage at or above TV (which, in one embodiment, is stored in controller 113). If not, flow proceeds to step 278 in which the current gate voltage is incrementally increased and a new test page is selected as the current test page. This new page is different from the previously used test page. In one embodiment, each new test page selected in block 278 is different from any previous page selected as a test page for a current erase operation. Also, in one embodiment, the gate voltage increment is tunable. If, at decision diamond 276, it is determined that at least 50% of those bits which received the soft program pulse in step 274 have a threshold voltage at or above TV, flow proceeds to step 280 in which the current gate voltage is stored (in, for example, controller 113, such as in register 136) for use as the initial gate voltage for the subsequent soft program which will be performed in steps 258 and 260. That is, the stored current gate voltage which resulted in increasing the threshold voltage of at least a predetermine percentage of the soft programmed determined bits (i.e. those bits determined in step 272 and soft programmed in step 274) to at least TV is then used as the initial gate voltage for subsequent soft programming. Flow then continues with step 258 of FIG. 4.

Therefore, note that the adaptive process of FIG. 5 allows for the use of a selected subset of the memory block to learn and determine the best initial gate voltage with which to begin the soft programming of the entire memory block. In this manner, the subsequent soft programming may use fewer iterations as compared to starting with a more conservative gate voltage. Although the determination of the initial gate voltage performed in FIG. 5 requires time to complete, overall time is saved by reducing the number of iterations required during soft programming the entire block which dominates total erase time of an erase operation. Note that, in alternate embodiments, other subsets of a memory block, other than a page, may be used to determine the initial gate voltage for the subsequent soft program. Also, in alternate embodiments, a process similar to that of FIG. 5 may be used to iteratively determine the best drain voltage with which to begin the soft programming of the memory block. That is, rather than determining an initial gate voltage, and initial drain voltage may instead be determined and used as the starting point for soft programming, in which the drain voltage is iteratively increased during soft programming in step 260. In yet another alternate embodiment, the process of FIG. 5 may be used to determine both an initial gate voltage and an initial drain voltage for the subsequent soft program. Alternate embodiments may use a selected subset of the memory block to determine other parameters or initial soft programming conditions or measure other results which may be used during the subsequent soft program. That is, the gate voltage and/or drain voltage which may be used during the subsequent soft program are only examples of the initial soft programming conditions which may be determined or selected based on the results or response of the selected subset of the memory.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the adaptive process may be used to determine initial values for different parameters other than or in addition to gate voltage for the soft program. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method including erasing bits in a memory block; identifying bits that have been over-erased; soft programming a first subset of the bits that have been over-erased; measuring results of soft programming the first subset of bits; selecting an initial voltage condition from a plurality of possible voltage conditions based on the results from soft programming the first subset of bits; and soft programming a second subset of bits that have been over-erased while applying the initial voltage condition to the bits in the second subset of bits, wherein the second subset comprises bits that are still over-erased when the step of selecting occurs. Item 2 includes the method of item 1 and further includes determining if there is a third subset of bits within the second subset of bits that need further soft programming; and if there is a third subset of bits, soft programming the third subset of bits using a voltage condition applied to the bits of the third subset of bits that includes a higher voltage than the initial voltage condition. Item 3 includes the method of item 1, wherein the bits have gates and the soft programming the first subset of bits comprises using an initial conservative gate voltage applied to the gates of over-erased bits of a first page, wherein the over-erased bits of the first page are within the first subset of bits. Item 4 includes the method of item 3, wherein if the step of measuring determines that the over-erased bits of the first page are not sufficiently soft programmed, the soft programming the first subset of bits further comprises using a first increased voltage applied to the gates of over-erased bits of a second page, wherein the over-erased bits of the second page are within the first subset of bits. Item 5 includes the method of item 4, wherein if the step of measuring determines that the over-erased bits of second page are not sufficiently soft programmed, the soft programming the first subset of bits further comprises using a second increased voltage greater than the first increased voltage applied to the gates of over-erased bits of a third page, wherein the over-erased bits of the third page are within the first subset of bits. Item 6 includes the method of item 5, wherein the step of selecting comprises selecting, as the initial voltage condition, the gate voltage used during a soft programming step that results in at least a predetermined percentage of the bits being increased above a minimum desired threshold voltage for being erased to at least a first threshold voltage that is less than a maximum desired threshold voltage for being erased. Item 7 includes the method of item 1, wherein the step of identifying bits that have been over-erased is further characterized as identifying bits that have been over-erased by less than a predetermined amount. Item 8 includes the method of item 7, wherein the step of soft programming a first subset of the bits is further characterized by the first subset of bits being characterized as comprising only bits that have been over-erased by less than the predetermined amount. Item 9 includes the method of item 1, and further includes determining if the soft programming the second subset results in all of the bits having a threshold voltage between a first threshold voltage and a second threshold voltage greater than the first threshold voltage, wherein an over-erased condition is present in a bit if the bit has a threshold voltage below the first threshold voltage. Item 10 includes the method of item 9, and further includes continuing soft programming using increasing voltage conditions until all of the bits have a threshold voltage between the first threshold voltage and the second threshold voltage.

Item 11 includes a method including erasing a block of memory cells in which a first plurality of the memory cells are erased to have a threshold voltage between a first threshold and a second threshold voltage less than the first threshold voltage, a second plurality of memory cells are erased to have a threshold voltage between the second threshold voltage and a third threshold voltage less than the second threshold voltage, and a third plurality of memory cells to have a threshold voltage less than the third threshold voltage; determining a response of a portion of the second plurality of memory cells to soft programming; selecting a soft programming condition based on the response of the portion of the second plurality of memory cells to the soft programming; and applying the programming condition that was selected in the step of selecting to the memory cells in the second subset that still have a threshold voltage between the second and third threshold voltage and to the third plurality. Item 12 includes the method of item 11, wherein the programming condition that was selected was an initial gate voltage. Item 13 includes the method of item 11, and further includes performing soft programming until all of the memory cells are between the first threshold voltage and the second threshold voltage. Item 14 includes the method of item 11, wherein determining a response comprises performing soft programming until a sample of the second plurality responds with a result of at least a predetermined fraction of the memory cells in the sample having a threshold voltage between a fourth threshold voltage and the first threshold voltage, wherein the fourth threshold voltage is less than the first threshold voltage and greater than the second threshold voltage. Item 15 includes the method of item 14, wherein the selecting the soft programming condition comprises selecting a gate voltage, which was applied to gates of memory cells in the sample, used during the soft programming that resulted in at least half of the memory cells in the sample having a threshold voltage between a fourth threshold voltage and the first threshold voltage. Item 16 includes the method of item 15, wherein the fourth threshold voltage is halfway between the first and second threshold voltages. Item 17 includes the method of item 16, wherein the predetermined fraction is one half.

Item 18 includes a method including erasing all bits in a memory block; identifying which bits in the memory block that have been over-erased by the erasing; testing a portion of the bits in the memory block that have been over-erased by the erasing to determine a desired gate voltage applied during soft programming that will result in increasing a threshold voltage of at least a predetermined percentage of the bits tested with soft programming at the desired gate voltage to at least an intermediate threshold voltage between a lowest desirable threshold voltage and a maximum desirable threshold voltage; and using the desired gate voltage applied to gates of the bits for soft programming all of the remaining over-erased bits. Item 19 includes the method of item 18, wherein the testing comprises applying increasing gate voltages for soft programming samples of bits until the desired gate voltage is reached for a sample of bits. Item 20 includes the method of item 19, wherein the soft programming is applied to samples of over-erased bits that have at least a minimum threshold voltage.

What is claimed is:

1. A method, comprising:
   erasing bits in a memory block;
   identifying bits that have been over-erased;
   soft programming a first subset of the bits that have been over-erased;
   measuring results of soft programming the first subset of bits;
   selecting an initial voltage condition from a plurality of possible voltage conditions based on the results from soft programming the first subset of bits; and
   soft programming a second subset of bits that have been over-erased while applying the initial voltage condition to the bits in the second subset of bits, wherein the second subset comprises bits that are still over-erased when the step of selecting occurs.

2. The method of claim 1, further comprising:
   determining if there is a third subset of bits within the second subset of bits that need further soft programming; and
   if there is a third subset of bits, soft programming the third subset of bits using a voltage condition applied to the bits of the third subset of bits that includes a higher voltage than the initial voltage condition.

3. The method of claim 1, wherein the bits have gates and the soft programming the first subset of bits comprises using an initial conservative gate voltage applied to the gates of over-erased bits of a first page, wherein the over-erased bits of the first page are within the first subset of bits.

4. The method of claim 3, wherein if the step of measuring determines that the over-erased bits of the first page are not sufficiently soft programmed, the soft programming the first subset of bits further comprises using a first increased voltage applied to the gates of over-erased bits of a second page, wherein the over-erased bits of the second page are within the first subset of bits.

5. The method of claim 4, wherein if the step of measuring determines that the over-erased bits of second page are not sufficiently soft programmed, the soft programming the first subset of bits further comprises using a second increased voltage greater than the first increased voltage applied to the gates of over-erased bits of a third page, wherein the over-erased bits of the third page are within the first subset of bits.

6. The method of claim 5, wherein the step of selecting comprises selecting, as the initial voltage condition, the gate voltage used during a soft programming step that results in at least a predetermined percentage of the bits being increased above a minimum desired threshold voltage for being erased to at least a first threshold voltage that is less than a maximum desired threshold voltage for being erased.

7. The method of claim 1, wherein the step of identifying bits that have been over-erased is further characterized as identifying bits that have been over-erased by less than a predetermined amount.

8. The method of claim 7, wherein the step of soft programming a first subset of the bits is further characterized by the first subset of bits being characterized as comprising only bits that have been over-erased by less than the predetermined amount.

9. The method of claim 1, further comprising determining if the soft programming the second subset results in all of the bits having a threshold voltage between a first threshold voltage and a second threshold voltage greater than the first threshold voltage, wherein an over-erased condition is present in a bit if the bit has a threshold voltage below the first threshold voltage.

10. The method of claim 9, further comprising continuing soft programming using increasing voltage conditions until all of the bits have a threshold voltage between the first threshold voltage and the second threshold voltage.

11. A method, comprising:
    erasing a block of memory cells in which a first plurality of the memory cells are erased to have a threshold voltage between a first threshold and a second threshold voltage less than the first threshold voltage, a second plurality of memory cells are erased to have a threshold voltage between the second threshold voltage and a third threshold voltage less than the second threshold voltage, and a third plurality of memory cells to have a threshold voltage less than the third threshold voltage;
    determining a response of a portion of the second plurality of memory cells to soft programming;
    selecting a soft programming condition based on the response of the portion of the second plurality of memory cells to the soft programming; and
    applying the programming condition that was selected in the step of selecting to the memory cells in the second subset that still have a threshold voltage between the second and third threshold voltage and to the third plurality.

12. The method of claim 11, wherein the programming condition that was selected was an initial gate voltage.

13. The method of claim 11, further comprising performing soft programming until all of the memory cells are between the first threshold voltage and the second threshold voltage.

14. The method of claim 11, wherein determining a response comprises performing soft programming until a sample of the second plurality responds with a result of at least a predetermined fraction of the memory cells in the sample having a threshold voltage between a fourth threshold voltage and the first threshold voltage, wherein the fourth threshold voltage is less than the first threshold voltage and greater than the second threshold voltage.

15. The method of claim 14, wherein the selecting the soft programming condition comprises selecting a gate voltage, which was applied to gates of memory cells in the sample, used during the soft programming that resulted in at least half of the memory cells in the sample having a threshold voltage between a fourth threshold voltage and the first threshold voltage.

16. The method of claim 15 wherein the fourth threshold voltage is halfway between the first and second threshold voltages.

17. The method of claim 16 wherein the predetermined fraction is one half.

18. A method, comprising:
  erasing all bits in a memory block;
  identifying which bits in the memory block that have been over-erased by the erasing;
  testing a portion of the bits in the memory block that have been over-erased by the erasing to determine a desired gate voltage applied during soft programming that will result in increasing a threshold voltage of at least a predetermined percentage of the bits tested with soft programming at the desired gate voltage to at least an intermediate threshold voltage between a lowest desirable threshold voltage and a maximum desirable threshold voltage; and
  using the desired gate voltage applied to gates of the bits for soft programming all of the remaining over-erased bits.

19. The method of claim 18, wherein the testing comprises applying increasing gate voltages for soft programming samples of bits until the desired gate voltage is reached for a sample of bits.

20. The method of claim 19, wherein the soft programming is applied to samples of over-erased bits that have at least a minimum threshold voltage.

* * * * *